United States Patent

[11] 3,579,138

[72] Inventors George J. Harris
Framingham;
Christopher C. Day, Newtonville, Mass.

[21] Appl. No. 852,635
[22] Filed Aug. 25, 1969
[45] Patented May 18, 1971
[73] Assignee American Optical Corporation
Southbridge, Mass.

[54] AUTOMATIC GAIN PRESETTING CIRCUIT
13 Claims, 1 Drawing Fig.

[52] U.S. Cl. .......... 330/86, 330/29, 330/110
[51] Int. Cl. .......... H03g 3/20
[50] Field of Search .......... 330/29, 52, 86, 130, 137, 110; 325/319, 407

[56] References Cited

UNITED STATES PATENTS 3,376,557 4/1968 Godinee .......... 330/86UX
3,378,786 4/1968 Andrea .......... 325/407X

*Primary Examiner*—Roy Lake
*Assistant Examiner*—James B. Mullins
*Attorneys*—William C. Nealon, Noble S. Williams, Robert J. Bird and Bernard L. Sweeney

ABSTRACT: An automatic gain presetting circuit for adjusting the gain of an operational amplifier. A full-wave rectifier and peak detector determine the peak input. A counter is incremented continuously and a reference voltage is developed which increases with the increasing count. The reference voltage is compared with the detected peak voltage and when the reference voltage is equal to or greater than the peak input voltage the counter ceases to increment. A plurality of resistors are connectable in parallel in the feedback path of the operational amplifier, but each individual resistor is connected in the feedback path only if a respective stage in the counter is in a predetermined state. The gain of the operational amplifier depends upon the total effective feedback impedance. The larger the final count in the counter, corresponding to a larger peak input signal, the smaller the total effective feedback impedance and the lower the gain of the amplifier.

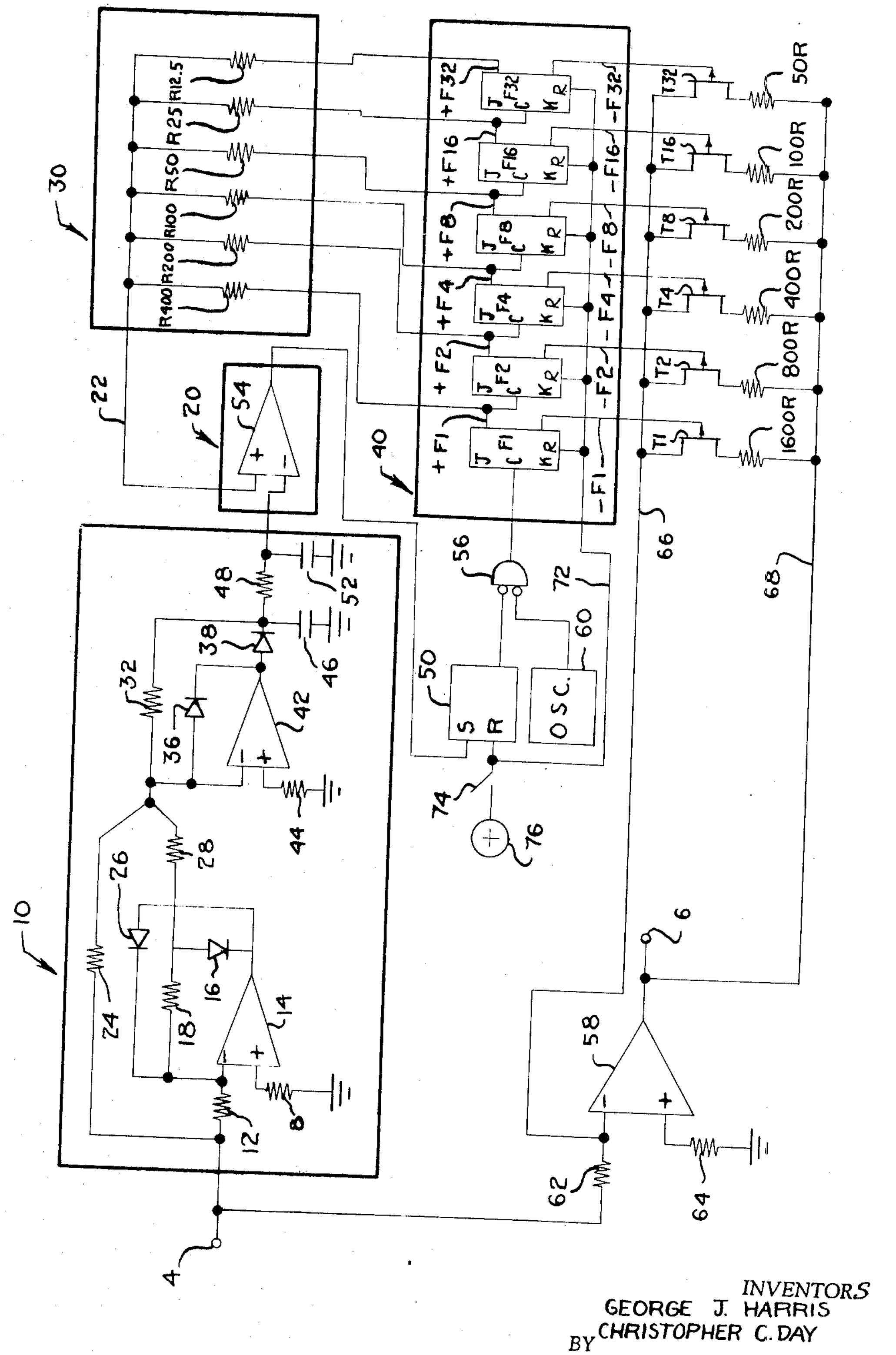
INVENTORS
GEORGE J. HARRIS
BY CHRISTOPHER C. DAY
Auster & Rothstein
ATTORNEYS

AUTOMATIC GAIN PRESETTING CIRCUIT

This invention relates to gain presetting circuits, and more particularly to automatic gain presetting circuits.

In many applications it is highly desirable to preset the gain of an amplifier in order to obtain a predetermined output level for an input signal whose magnitude can vary over a broad range. A gain presetting circuit is different from the conventional automatic gain control circuit. In the latter, the gain of the amplifier is continuously varied in order that the output level be of a constant magnitude even though the input level continuously changes. In a gain presetting circuit, on the other hand, the gain of the amplifier is initially set to provide an output signal of a predetermined magnitude for an input signal which occurs during an initial monitoring period. Thereafter, the output signal does change in magnitude as the input signal changes in magnitude. A typical a typical application in which gain presetting is highly advantageous is the monitoring of electrocardigraphic signals. Very often the electrocardiograhic signals are supplied to an automatic waveform analyzer which generates an output only when there is a change from a normal repetitive pattern. In order to enable the analyzer circuit to operate efficiently, the "normal" signal amplitude should be adjusted to a standard magnitude such that all circuits operate within their prescribed limits. This is accomplished by a gain presetting circuit—the gain of the amplifier is adjusted during an initial monitoring period such that the input to the analyzer is of a predetermined magnitude. Thereafter, the gain remains constant and the analyzer responds to variations in amplitude from the predetermined level.

Heretofore, gain presetting has been accomplished by manually adjusting a gain control (typically, a potentiometer) while at the same time viewing the signal on an oscilloscope. The gain is adjusted until the signal viewed during the initial monitoring period is of the desired magnitude. The obvious disadvantage of this approach is the necessity of providing an oscilloscope or other display, and the difficulty in consistently manually adjusting the signal to a desired magnitude. Manual adjustment is time-consuming, expensive and inefficient.

It is a general object of our invention to provide an automatic gain presetting circuit.

Briefly, in accordance with the principles of our invention, the input signal is monitored during an initial period, e.g., 20 seconds, during which time the peak amplitude (of either polarity) is determined. The input signal, in addition to being applied to the peak detector is also applied to the input of an amplifier whose gain is adjusted to produce an output level of a predetermined magnitude corresponding to the peak input. The amplifier is provided with a feedback impedance, the impedance being varied to control the gain of the amplifier.

After the initial monitoring period, an oscillator supplies pulses to the input of a counter having a number of stages. Each stage of the counter is connected to a respective resistor in a resistor network in such a way that as the counter increases a reference voltage grows in magnitude. This reference voltage is compared to the signal previously detected until the reference voltage exceeds the peak. At this time the counter stops incrementing. Each stage of the counter also controls the insertion of a respective resistor in the feedback impedance of the amplifier. The total feedback impedance is inversely proportional to the count in the counter and the value of the reference voltage when the counter ceased to increment. The feedback resistors have values such that the particular resistors included in the feedback impedance when the reference voltage exceeds the peak detected voltage cause the output of the amplifier to be at a level equal to the desired magnitude.

It is a feature of our invention to increment a counter for developing an increasing reference voltage until the reference voltage exceeds a previously detected peak input signal voltage, the final count in the counter determining the magnitude of a feedback impedance in an amplifier to control the output of the amplifier to be at a predetermined level for an input signal equal to the detected peak.

Further objects, features and advantages of the invention will become apparent upon a consideration of the following detailed description in conjunction with the drawing which depicts an illustrative embodiment of the invention.

Referring to the drawing, the input signal is applied at terminal 4 and feeds two separate subsystems. The first subsystem includes full-wave rectifier and peak detector 10, comparator 20, resistor network 30, binary counter 40 and various control circuits. The second subsystem includes amplifier 58 together with various feedback resistors 50R—1600R. The coupling between the two subsystems consists of the connection of the counter output conductors –F1 through –F32 to the gates of the six field-effect transistors T1—T32. The gain of amplifier 58 is determined by the effective feedback impedance connected between conductors 66, 68. The six resistors 50R—1600R are normally not connected in the circuit because the six field-effect transistors T1—T32 are normally off. However, as the counter cycles various ones of the transistors turn on to control the connection of the respective resistors between conductors 66, 68. As illustrated, output 6 of amplifier 58 is fed back only to the input of amplifier 58, and is not conducted to the first subsystem described above.

Full-wave rectifier and peak detector 10 serves to derive a voltage across capacitor 52, connected to the minus input of comparator 54, whose magnitude is dependent upon the peak signal at terminal 4. Each of amplifiers 14 and 42 is an operational amplifier whose plus input is grounded. The circuit operates to develop a voltage across capacitor 46 which is positive and has a magnitude equal to twice the maximum positive or negative excursion of the input signal from its base line at terminal 4.

Consider the case in which a positive signal appears at terminal 4. Since the signal is applied to the minus input of amplifier 14, the signal at the output of the amplifier is negative. Diode 16 conducts and the output signal is sent back through resistor 18 to the minus input of the amplifier. With the plus input of the amplifier being grounded through resistor 8, it is well known in the art that the gain of the operational amplifier is equal to the ratio of the magnitudes of resistors 18 and 12. Both of the resistors have the same magnitude in the illustrative embodiment of the invention and thus the gain of operational amplifier 14 for a positive input is –1. The output signal is applied through resistor 28 to the minus input of operational amplifier 42, and thus the output of this amplifier is positive. Diode 38 conducts and thus the output of operational amplifier 42 is fed back through resistor 32 to the minus input of the amplifier. Since the plus input is grounded through resistor 44, the gain of operational amplifier 42 is equal to the ratio of the magnitudes of resistors 32 and 28. In the illustrative embodiment of the invention resistor 28 has a magnitude of 25K and resistor 32 has a magnitude of 100K. Thus the total gain of the two stages for a positive signal transmitted through resistor 12 to amplifier 14 is +4.

However, the input signal at terminal 4 is also applied directly through resistor 24 to the minus input of operational amplifier 42. Resistor 24 has a magnitude of 50K. The magnitude of the gain of amplifier 42 with respect to a signal applied trough resistor 24 is equal to the ratio of the magnitudes of resistors 32 and 24, or 2, and the gain is negative because for a positive input signal the output of amplifier 42 is negative. By the principle of superposition, the total gain is simply the sum of the two individual gains, that is, the gains resulting from the application of the input signal through resistor 12 to the minus input of amplifier 14, and the application of the signal through resistor 24 to the minus input of amplifier 42. The total gain is thus +4–2, or +2. For any signal $+e$ at terminal 4, the signal at the cathode of diode 38 is $+2e$. This is true, however, only if the one-way conduction of the diode is not considered. With the diode in the circuit, capacitor 46 charges to twice the input voltage. If the input voltage decreases, diode 38 becomes reverse biased since the output of amplifier 42 is less than the voltage across capacitor 46. Consequently, capacitor 46 charges to twice the peak positive potential at terminal 4 and remains at that level (except for leakage through resistor 32, to be described below).

For the case of a negative input signal at terminal 4, the gain of amplifier 14 is zero. The negative signal transmitted through resistor 12 to the minus input of the amplifier results in a positive signal at the output. The positive signal is shorted through diode 26 back to the minus input. Thus in effect the feedback resistance is zero and the gain of the stage is likewise zero. However, the negative input signal is also transmitted through resistor 24 to the minus input of amplifier 42. The output of the amplifier is positive, diode 38 is forward biased, and the output is fed back to the input of the amplifier through resistor 32. Since the ratio of the magnitudes of resistors 32 and 24 is 2, the overall gain is +2. Thus if the input signal is negative, capacitor 46 still charges to twice the peak level—and the capacitor once again charges in the positive direction.

It should be noted that diode 36 performs no function in the derivation of the peak signal across capacitor 46. However, the diode is required for stability purposes. The diode serves to cut down the gain of the stage to zero in the case of a negative output in order that transient signals not result in oscillations or the saturation of various transistors in operational amplifier 42.

Although capacitor 46 charges to twice the peak input voltage, between input pulses the capacitor discharges slightly through resistor 32. Thus there is a ripple in the output voltage. Resistor 48 and capacitor 52 smooth this ripple. It is necessary to provide a discharge path (resistor 32) for capacitor 46 in many cases. For example, in the case of electrocardiographic monitoring it is known that periodically very large pulses can be detected at the input. Were one of these pulses to charge capacitor 46 to an abnormally high level, the resulting gain of amplifier 58 would be set too low for the normal case. For this reason, resistor 32 allows capacitor 46 to discharge following each input pulse. The resulting voltage across capacitor 46, and necessarily across capacitor 52, is less than twice the peak input voltage but is for the most part determined by the peak input voltage. By averaging input signal fluctuations over several seconds, a single large pulse cannot cause incorrect gain presetting.

The six flip-flops F1—F32 are arranged to form a binary counter. Each flip-flop is of the J–K type. When a positive potential is applied to the reset (R) input the flip-flop is reset. Consider, for example, flip-flop F1. When it is reset, conductor +F1 is at ground potential and conductor −F1 is at a positive potential. Any negative step applied to the clock (C) input of the flip-flop forces it to change state. Thus when the first negative step is applied to the clock input of flip-flop F1, conductor +F1 goes positive and conductor −F1 goes to ground. The second clock input causes the state of flip-flop F1 to change once again. When conductor +F1 goes from a positive potential to ground, the negative step appears at the clock input of flip-flop F2, and this flip-flop switches to the 1 state with conductor +F2 going from ground to a positive potential. Similar remarks apply to all of the other flip-flops. Counter 40, comprising the six flip-flops, is of a type well known to those skilled in the art. For any flip-flop which is in the 1 state, its respective plus output conductor is at a positive potential and its minus output conductor is at ground potential.

Resistor network 30 comprises six resistors, each connected to a respective one of the counter output conductors, and all joined to conductor 22. The resistors have magnitudes as indicated by the numerals used to designate them. For example, resistor R400 has a magnitude of 400K and resistor R12.5 has a magnitude of 12.5K. The "weights" of the resistors are such that they correspond inversely to the relative weights of flip-flops F1—F32. Each of the flip-flops, when in its 1 state, has a 5-volt potential on its respective plus output conductor. If all of the flip-flops except flip-flop F32 are in the 0 state, in effect all of the resistors in the network are returned to ground except resistor R12.5. This resistor is connected to a 5-volt potential and the resulting potential on conductor 22 is approximately 2.5 volts. Similarly, flip-flop F16 contributes 1.25 volts to the total potential on conductor 22, and each lower order stage contributes a smaller potential by a factor of 2. This is due to the fact that the magnitudes of the resistors in network 30 increase by factors of 2 for the respective counter stages from the highest order stage to the lowest order stage. The overall arrangement is such that if the counter starts off with a 0 count (000000), as its count successively increments the output voltage on conductor 22 is stepped from 0 to 5 volts in 63 equal steps.

In a typical application in which the automatic gain presetting circuit of the invention is utilized, in conjunction with electrocardiographic monitoring, the patient electrode is connected to the amplifier for approximately 20 seconds before switch 74 is closed in order that the voltage developed across capacitor 52 be indicative of the peak input voltage. Thereafter, switch 74 is momentarily operated. The positive potential of source 76 is applied to the reset terminal of flip-flop 50 as well as to conductor 72, the latter conductor being connected to the reset terminal of each of the J–K flip-flops in counter 40. All of the flip-flops reset, with all of the plus output conductors going to ground level and a ground signal appearing on conductor 22 via resistance network 30. At the same time, all of the minus output conductors of counter 40 go positive. Each of these conductors is connected to the gate terminal of one of the six respective field-effect transistors T1—T32; with a positive potential at the gate of any one of these transistors the transistor effectively presents an infinite impedance between its drain and source terminals.

With flip-flop 50 reset, its output conductor connected to one input of NAND gate 56 is low in potential. Oscillator 60 oscillates at a 100 Hz. rate and applies negative pulses to the other input of the NAND gate. Consequently, as long as flip-flop 50 is reset, the output of NAND gate 56, connected to the clock input of flip-flop F1, exhibits positive pulses at a rate of 100 Hz. At the end of each pulse, with the negative step, flip-flop F1 switches state. Counter 40 requires a little more than 1 second to go through a full count from 0 to 127.

Under ordinary circumstances, however, the counter does not reach its maximum count. The voltage across capacitor 52 is utilized as one input to comparator 20, which consists of a single operational amplifier arranged in a comparator configuration. Conductor 22 is connected to the other input of the comparator. As long as the voltage across capacitor 52 is greater than the voltage on conductor 22 the output of the comparator is at ground potential. However, as soon as the voltage on conductor 22 equals or exceeds the voltage on capacitor 52 the output of the comparator is connected to the set input of flip-flop 50 and accordingly the flip-flop is set in its 1 state. With the setting of the flip-flop, the output conductor goes high and NAND gate 56 is disabled. Thus counter 40 continues to increment until the voltage on conductor 22 equals or just exceeds the voltage across capacitor 52.

The count represented in the counter after flip-flop 50 is set in the 1 state is indicative of the relative gain required of the system. For a low count stored in the counter, a large gain is required since comparator 20 sets flip-flop 50 in the 1 state after the voltage on conductor 22 has increased only slightly from ground. On the other hand, if the input has a very large magnitude, a relatively large voltage is required on conductor 22 before the output of comparator 20 changes state, and this in turn results in a relatively large count being stored in the counter.

When a ground potential is applied to the gate terminal of one of transistor T1—T32, the transistor presents an effective short circuit between its drain and source terminals. Effectively, the respective one of resistors 50R—1600R is connected between conductors 66, 68. Depending on how many of these transistors conduct, there is a different total impedance connected between conductors 66, 68. These conductors are connected between the output of operational amplifier 58 and the minus input. The plus input of the operational amplifier is grounded through resistor 64 and the minus input is connected through resistor 62 to input terminal 4. As in the case of operational amplifiers 14 and 42, the gain of operational amplifier 58 from terminal 4 to terminal 6 is equal to the magnitude of the feedback impedance (connected between conductors 66, 68) divided by the magnitude of resistor 62.

In the illustrative embodiment of the invention resistor 62 is 20K, resistor 50R has a magnitude of 50K, resistor 100R has a magnitude of 100K, etc. (Resistor 1600R has a magnitude of 1.6M.) The resistors have relative binary weights which are in inverse proportion to the relative binary weights of the respective flip-flops in counter 40 which control their insertion in the feedback path of operational amplifier 58. With counter 40 initially reset, all of transistors T1—T32 are off; the effective feedback impedance is infinite and the gain of amplifier 58 is at a maximum. The insertion of each resistor in the feedback path lowers the feedback impedance and thus decreases the amplifier gain. For example, it is apparent that resistor 50R, when connected in the feedback path, lowers the overall gain of the amplifier to the greatest extent since it is the smallest of the six feedback resistors. This is to be expected because if flip-flop F32 is in the 1 state, it is an indication that the input level is quite high because a large count was required before the voltage on conductor 22 was sufficient to change the state of comparator 20. If flip-flop F32 is the only flip-flop in the 1 state, resistor 50R is the only resistor in the feedback path and the gain of amplifier 58 is 50/20 or 2.5. If resistor 100R is the only resistor in the feedback path, i.e., flip-flop F16 is the only flip-flop in the counter which is in the 1 state, the gain of the amplifier is 100/20 or 5. The maximum gain is achieved when only flip-flop F1 in the counter is in the 1 state, indicating a condition of very low input level and therefore the setting of flip-flop 50 after only a single pulse from oscillator 60 has been applied to the count input of flip-flop F1. In such a case the gain of the amplifier is 1600/20 or 80. The minimum gain is achieved when the counter has counted to the maximum value of 63; the minimum gain is approximately 1.25. (The maximum count of counter 40 is made greater than any count which will actually be achieved in practice because if flip-flop 50 is not set by the time the counter reaches the maximum value, the counter will next be placed in the 0 state and the voltage on conductor 22 will drop abruptly to ground level.)

As an intermediate example, consider the case in which the flip-flops in the order of decreasing significance, are in the respective states 0, 1, 0, 1, 0, 0 (corresponding to a count of 20). Resistors 400R and 100R are in the feedback path and their parallel impedance is (100) (400)/(500), or 80K. The overall gain is thus 80/20, or 4. It can be shown that the gain of amplifier 58 drops off smoothly from its initial maximum value in direct proportion to the increasing count in counter 40. Thus, as counter 40 increases in count, the reference signal on conductor 22 increases in value. However, as counter 40 increases in count the value of the parallel combination of feedback resistors decreases. Thus, as the reference signal on conductor 22 increases, the feedback resistance of amplifier 58 decreases, and therefore its gain decreases.

Although the invention has been described with reference to a particular embodiment, it is to be understood that this embodiment is merely illustrative of the application of the principles of the invention. For example, it is apparent that the system could be utilized as a periodic automatic gain control circuit with switch 74 being operated periodically, e.g., once every few seconds, in order to adjust the gain of amplifier 58 in accordance with any new input signal level. Thus it is to be understood that numerous modifications may be made in the illustrative embodiment of the invention and other arrangements may be devised without departing from the spirit and scope of the invention.

We claim:

1. An automatic gain presetting circuit for an amplifier comprising means for deriving a signal dependent upon the peak amplitude of an input signal, a counter, means for successively incrementing said counter, means responsive to the successive incrementing of said counter and not to said amplifier for deriving a continuously increasing reference signal, means for comparing said reference signal with said derived signal and responsive to said reference signal exceeding said derived signal for inhibiting the incrementing of said counter, and means dependent upon the count stored in said counter for controlling the gain of said amplifier.

2. An automatic gain presetting circuit in accordance with claim 1, wherein said amplifier is an operational amplifier including a plurality of feedback resistors selectively connectable therein, and said gain controlling means controls the connection of respective resistors in the feedback path of said amplifier dependent upon the values of respective bits represented in said counter.

3. An automatic gain presetting circuit in accordance with claim 2 wherein said counter includes a plurality of flip-flop stages and said reference signal deriving means includes a plurality of weighted resistors each connected at one end thereof to a respective one of said stages with all of said resistors being connected together at the other ends thereof to said comparing means.

4. An automatic gain presetting circuit in accordance with claim 3 wherein each of said flip-flop stages when in a selected state controls the connection of a respective one of said resistors in the feedback path of said amplifier, with all of the connected resistors being connected in parallel in said feedback path, and said feedback resistors have a sequence of magnitudes which correspond inversely to the order of significance of the respective bits represented in said counter.

5. An automatic gain presetting circuit in accordance with claim 4 wherein said signal deriving means includes a full-wave rectifier, peak detecting means, and means for averaging out input signal fluctuations during an initial monitoring period prior to the incrementing of said counter.

6. An automatic gain presetting circuit in accordance with claim 1 wherein said signal deriving means includes a full-wave rectifier, peak detecting means, and means for averaging out input signal fluctuations during an initial monitoring period prior to the incrementing of said counter.

7. An automatic gain presetting circuit for an amplifier comprising means for deriving a signal dependent upon the peak amplitude of an input signal, counting means, means for successively changing the count in said counting means in a predetermined direction, means responsive to successive changes in the count in said counting means and not to said amplifier for deriving a continuously changing reference signal, means for comparing said reference signal with said derived signal and responsive to a relative change in polarity for inhibiting changes in the count in said counting means, and means dependent upon the final count in said counting means for controlling the gain of said amplifier.

8. An automatic gain presetting circuit in accordance with claim 7 wherein said gain controlling means is operative to decrease the gain of said amplifier in direct proportion to the total change in the count in said counting means prior to the inhibiting of changes in said count.

9. An automatic gain presetting circuit in accordance with claim 8 wherein said amplifier includes a plurality of feedback resistors selectively connectable in parallel therein, said counting means includes a plurality of flip-flop stages, and said gain controlling means includes means for connecting each of said feedback resistors in the feedback path of said amplifier responsive to a respective one of said flip-flop stages being in a predetermined state.

10. An automatic gain presetting circuit in accordance with claim 9 wherein said reference signal deriving means includes a plurality of reference means resistors each connected at one end thereof to a respective one of said flip-flop stages with all of said reference means resistors being connected together at the other ends thereof to said comparing means.

11. An automatic gain presetting circuit in accordance with claim 10 wherein the magnitudes of each of said plurality of feedback resistors and said plurality of reference means resistors are related to each other in a binary sequence.

12. An automatic gain presetting circuit in accordance with claim 11 wherein said signal deriving means includes a full-wave rectifier, peak detecting means, and means for averaging out input signal fluctuations during an initial monitoring period prior to the changing of the count in said counter.

13. An automatic gain presetting circuit in accordance with claim 7 wherein said signal deriving means includes a full-wave rectifier, peak detecting means, and means for averaging out input signal fluctuations during an initial monitoring period prior to the changing of the count in said counter.